United States Patent [19]
Mozingo et al.

[11] Patent Number: 5,230,000
[45] Date of Patent: Jul. 20, 1993

[54] BUILT-IN SELF-TEST (BIST) CIRCUIT

[75] Inventors: Kenneth D. Mozingo, Yorkville; Charles E. Stroud, North Aurora, both of Ill.

[73] Assignee: AT&T Bell Laboratories, Murray Hill, N.J.

[21] Appl. No.: 693,114

[22] Filed: Apr. 25, 1991

[51] Int. Cl.$^5$ .......................................... H04B 17/00
[52] U.S. Cl. ................................................. 371/22.4
[58] Field of Search ................. 371/22.4, 22.5, 20.5, 371/22.1, 22.6, 25.1, 61, 62; 370/112

[56] References Cited

U.S. PATENT DOCUMENTS

| | | | |
|---|---|---|---|
| 4,513,418 | 8/1985 | Bardell et al. | 371/25 |
| 4,551,838 | 11/1985 | Gannett | 371/25 |
| 4,701,916 | 10/1987 | Naven et al. | 371/22.4 |
| 4,764,926 | 8/1988 | Knight et al. | 371/27 |
| 4,768,196 | 8/1988 | Jou et al. | 371/22.2 |
| 4,905,241 | 2/1990 | Schmid et al. | 371/22.5 |
| 4,918,378 | 4/1990 | Katircioglu et al. | 371/22.4 |
| 5,084,874 | 1/1992 | Whitset, Jr. | 371/22.4 |
| 5,138,619 | 8/1992 | Fasang et al. | 371/22.5 |

OTHER PUBLICATIONS

"An Automated BIST Approach for General Sequential Logic Synthesis", C. E. Stroud, 25th ACM/IEEE Design Automation Conference, 1988, Paper 3.1, pp. 3-8.

"Circular BIST with Partial Scan," M. M. Pradhan, E. J. O'Brien, S. L. Lam, and J. Beausang, Proceedings, IEEE 1988 International Test Conference, Paper 35.1, pp. 719-729.

Primary Examiner—Robert W. Beausoliel, Jr.
Assistant Examiner—Phung M. Chung
Attorney, Agent, or Firm—Robert B. Levy

[57] ABSTRACT

Testing of data path circuitry (12) within an integrated circuit chip (10) is accomplished by a test circuit (22) comprised of a Signature Analysis Register (SAR) (30). The SAR (30) generates test signals for input to data path circuitry (12) and compacts response signals produced by the data path circuitry following receipt of the test signals. A blocking circuit (28) blocks an initial one of the response signals from being received by the SAR (30) until the test signals from the SAR have propagated through the data path circuitry (12). Bypass multiplexers (34) multiplex the test signals generated by the SAR (30) with input data normally supplied to the data path circuitry (12) to allow the test circuit (22) to be bypassed during intervals other than testing. Loopback multiplexers (26) are also provided to multiplex the output data of the data path circuitry (12) with the input data received by the data path circuitry (12) to allow for testing of a chain of integrated circuits (10) on a circuit board (53).

12 Claims, 3 Drawing Sheets

BUILT-IN SELF-TEST (BIST) CIRCUIT

TECHNICAL FIELD

This invention relates to a test circuit for insertion into the input portion of an electronic device for allowing the device to test itself.

BACKGROUND OF THE INVENTION

There is currently a trend among manufacturers of integrated circuits to increase the number (e.g., the density) of circuits on a single chip to achieve higher levels of performance and greater functionality. As integrated circuits have become more dense, the ability to test such integrated circuits by conventional techniques has become increasingly more difficult. To overcome this difficulty, much effort has been devoted to accomplishing built-in self-testing of such integrated circuits by configuring them with circuitry for that purpose.

To date, there have been several known types of built-in self-test (BIST) circuits, including BILBO (Built-In Logic Block Observer) and "circular" BIST. These approaches are not without their disadvantages. One critical disadvantage is that current BIST circuits often require a trade-off between fault coverage (as defined by the percentage of total possible faults that can be diagnosed) and overhead penalty (as defined by the percentage of the total area of the integrated circuit that must be devoted to the BIST circuit). Obviously, the greater the amount of the area of the integrated circuit that must be dedicated to a BIST circuit, the less the amount of area available for implementing the normal or regular function of the chip. For this reason, BIST circuits which impose a high overhead penalty, say above 20% of the total chip area, are not favored even through such BIST circuits may achieve high fault coverage.

Yet another disadvantage of current BIST circuits is that few if any offer the ability to test more than the integrated circuit in which such circuitry is incorporated. The lack of flexibility of current BIST circuitry to accomplish testing at the circuit board, or even at the system level, often imposes inefficiencies during testing.

Thus, there is a need for a BIST circuit, for incorporation with a device, which overcomes the above-enumerated disadvantages.

SUMMARY OF THE INVENTION

Briefly, in accordance with a preferred embodiment of the invention, a technique is disclosed for testing a circuit within an electronic device (e.g., an integrated circuit). Such testing is carried out by first multiplexing a test signal, from a multiple-input Signature Analysis Register (SAR) within the electronic device, with input data normally directed to the circuitry under test, so that during selected intervals, test data from the SAR will be supplied to the circuitry under test. Upon receipt of an initial test signal, the circuitry under test in the device under test will return an initial response signal. The initial response signal is multiplexed with the input data to the circuitry under test to allow either the response signal or the input data (which may take the form of a response signal from another device) to be fed back to the SAR. The initial response signal supplied to the SAR is blocked from entering the SAR for a predetermined time interval following generation of the previous test signal to allow sufficient time for the initial test signal produced by the SAR to propagate through the circuitry under test.

The initial response signal supplied to the multiple-input SAR, after the delay interval, is compacted (logically combined) with the previous contents thereof (which may initially take the form of a seed value written into the SAR at the outset of operation). Each time the multiple-input SAR is subsequently clocked, the SAR generates another test signal, which, in turn, causes another response signal to be generated by the circuit under test. Each subsequently generated response signal is supplied back to the multiple-input SAR without blocking for compaction with the contents of the SAR. This process is repeated for a predetermined number of cycles, after which time a comparison is made between the compacted contents of the multiple-input SAR (i.e., its signature) and the signature which would be obtained for a fault-free circuit. By comparing the actual signature from the SAR to the signature obtained for a fault-free condition, a fault within the circuitry being tested will be found. Further, by multiplexing the test data with the input data to the circuitry under test, and by multiplexing the response data with such input data, a plurality of interconnected circuits under test can be tested as a system.

DETAILED DESCRIPTION

Figure 1:
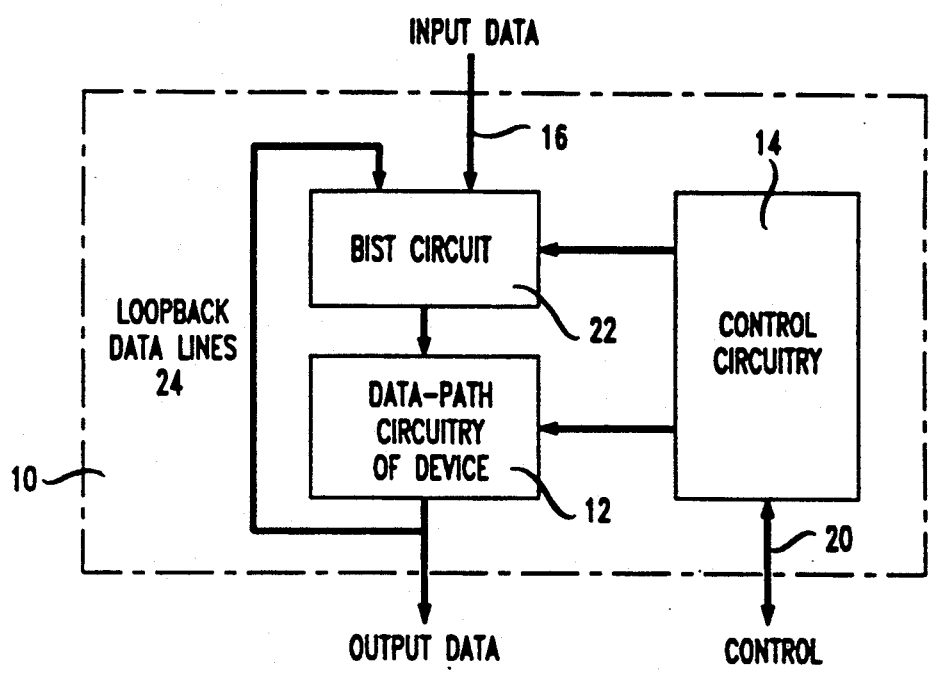
FIG. 1 is a block schematic diagram of an integrated circuit embedded within which is a built-in self-test (BIST) circuit in accordance with the invention.

Referring to FIG. 1, there is shown a block schematic diagram of a very large scale integrated circuit 10 which is generally comprised of data path circuitry 12 and control circuitry 14. The data path circuitry 12 is generally comprised of a plurality of circuit elements (not shown), such as logic gates, multiplexers, adders etc., which are supplied with input data on an input bus 16, containing a plurality of individual data lines as represented by the data line $16_i$ in FIG. 3. The data path circuitry 12 manipulates data received on the input bus 16 in response to control signals from the control circuitry 14, typically comprised of logic gates, flip flops and/or data storage elements (not shown), to yield output data on an output bus 18. The control signals supplied from the control circuitry 14 to the data path circuitry 12 are generated by the control circuitry in accordance with input commands received from an external system (not shown) via a control bus 20. The control bus 20 is bi-directional to allow status information to be received by the external system from the control circuitry 14.

Figure 2:
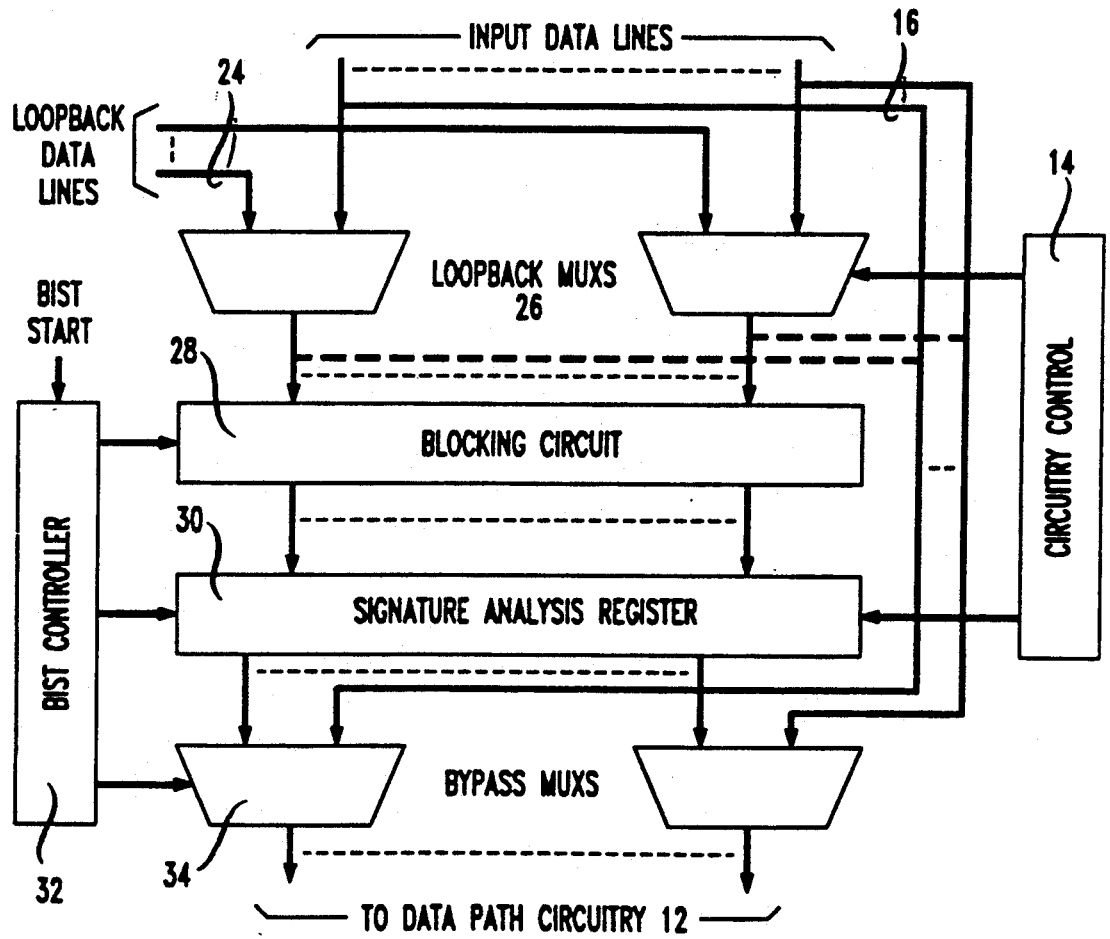
FIG. 2 is a block schematic diagram of the BIST circuit of FIG. 1.
Figure 3:
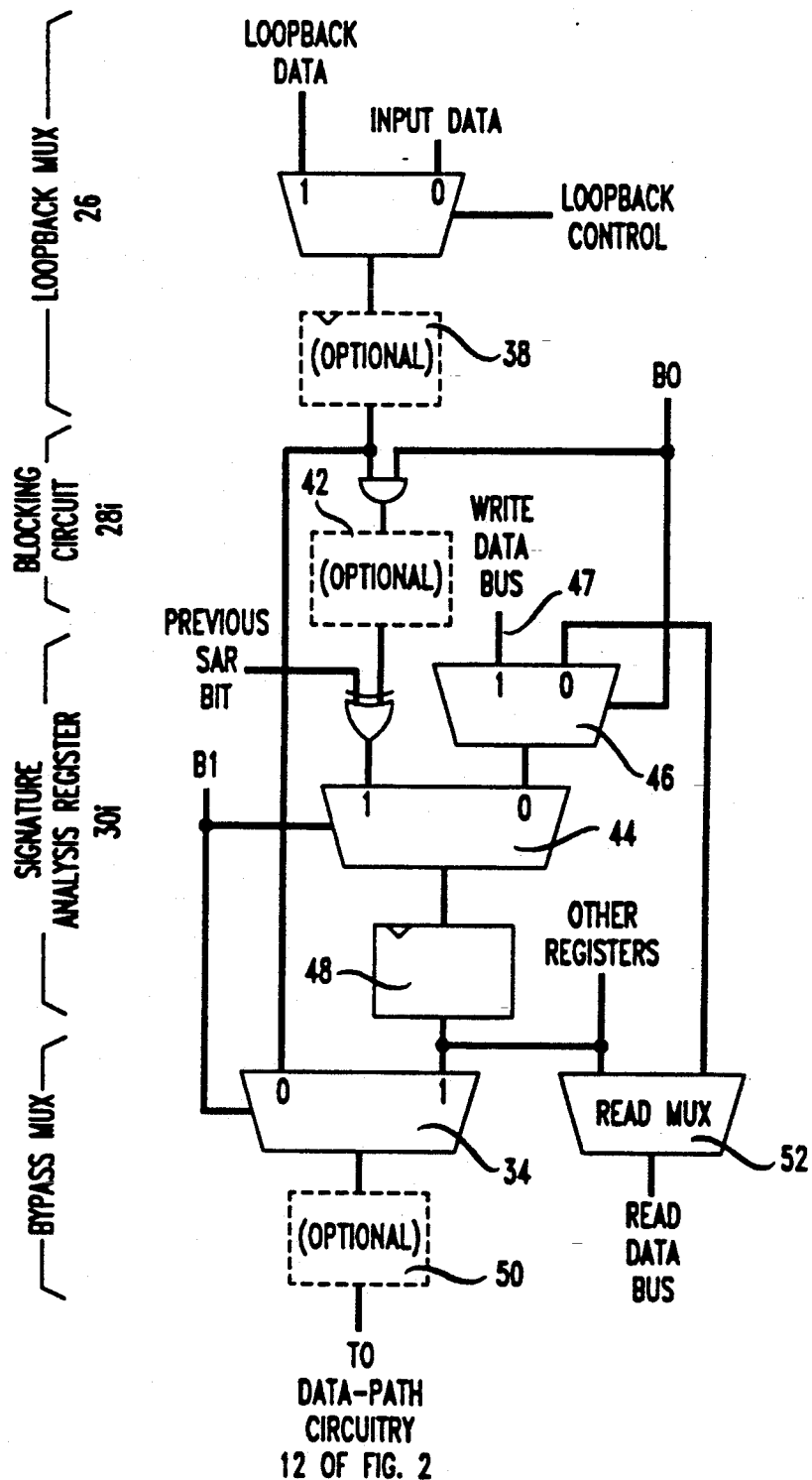
FIG. 3 is a diagram showing a portion of the BIST circuit of FIG. 2 associated with a single data line.

In accordance with the present invention, a built-in self-test (BIST) circuit 22, better described with respect to FIGS. 2 and 3, is embedded within the integrated circuit 10 so that at least a portion of the circuit is interposed between the input bus 16 and the data path circuitry 12. As will be described in greater detail below, the BIST circuit 22 serves to test the data path circuitry 12 by supplying test signals thereto and by compacting response signals fed back to the BIST circuit from the data path circuitry through a plurality of loopback data lines 24.

Referring now to FIG. 2, there is shown a block schematic diagram of the BIST circuit 22 of the invention. The BIST circuit 22 includes a plurality of loopback multiplexers 26, each having a first input coupled to a separate one of the loopback data lines 24, and a second input coupled to a separate one of the input data lines $16_i$ (see FIG. 3) of the data bus 16 of FIG. 1. Each of the loopback multiplexers 26 is responsive to a control signal from the control circuitry 14, and, in accordance with the state of such signal, each multiplexer passes to its output either signal received from the loopback data line 24 or the signal received on the data bus 16. As will be appreciated hereinafter, the loopback multiplexers 26 should each be interposed between the input bus 16 and the data path circuitry 12 of FIG. 1.

The output of each loopback multiplexer 26 is supplied to a separate one of a set of inputs of a blocking circuit 28 whose outputs are each coupled to a separate one of a set of inputs of a multiple-input Signature Analysis Register (SAR) 30, typically, a linear feedback shift register, configured as described with respect to FIG. 3. The blocking circuit 28, also described in greater detail in FIG. 3, serves to block the output signal of each loopback multiplexer 26 from being received at a corresponding input of the multiple-input SAR 30 in response to a control signal received from a BIST controller 32, which is typically comprised of a counter. Both the blocking circuit 28 and the SAR 30, although shown as interposed between the input bus 16 and the data path circuitry 12, need not be so positioned, but could be located elsewhere.

The SAR 30 serves two distinct functions. The first is generating successive streams of test signals. Each signal in each successive stream is produced by the SAR 30 in response to a clock signal (not shown) and is supplied to a first input of a separate one of a plurality of bypass multiplexers 34, each multiplexer having its second input coupled to a corresponding line $16_i$ (see FIG. 3) of the data bus 16. Each bypass multiplexer 34 is controlled by the BIST controller 32 so as to selectively pass either a test signal from the SAR 30, or the data from a corresponding line of the data bus 16, to the data path circuitry 12 of FIG. 1.

In addition to generating test signals, the SAR 30 also serves to compact (i.e., logically combine) response signals generated by the data path circuitry 12, following receipt of the test signals fed back to the SAR. The resultant compaction of the response signals by the SAR 30 yields a signature (i.e., a pattern of bits representing the contents of the SAR) which is reflective of the operation of the data path circuitry 12, i.e., whether the data path circuitry contains an y faults. By comparing the signature of the SAR 30 resulting from compaction of the response signals supplied thereto during testing, to a fault-free signature, that is, the signature obtained when no faults are present, the presence of faults in the data path circuitry may be detected.

Both the blocking circuit 28 and the multiple-input SAR 30 receive a plurality of individual signals, the number of separate signals corresponding to the number of individual data lines $16_i$ in the data bus 16 of FIG. 1. In practice, both the blocking circuit 28 and the multiple-input SAR 30 can be viewed as being comprised of a plurality of individual channels, each corresponding to a separate one of the data lines $16_i$. Representative channels $28_i$ and $30_i$ of the blocking circuit 28 and the SAR 30, respectively are shown in FIG. 3. Each blocking circuit channel $28_i$ is comprised of an AND gate 36 having a first input supplied with the output signal of a corresponding one of the loop back multiplexers 26, either directly, or through an optional flip-flop 38 (shown by dashed lines), placed between the and gate and the loopback multiplexer for timing purposes. The AND gate 36 has a second input supplied with a first control signal B$\phi$ from the BIST controller 28 of FIG. 2. While the control signal B$\phi$ is at a logic "low" or zero level, the output signal from the loopback multiplexer 26 (as passed through the flip-flop 38 if present) will be blocked by the AND gate 36 from passing to the channel $30_i$ of the SAR 30. Once the signal B$\phi$ goes to a logic "high" or 1 level, then the AND gate 36 passes a signal from the loopback multiplexer 26 to the SAR channel $30_i$.

The SAR channel $30_i$ comprises an exclusive-OR (XOR) gate 40 having a first input supplied with the output of the AND gate 36 of the corresponding blocking circuit channel $28_i$, either directly or through an optional flip-flop 42 (shown by dashed lines) which may be provided for timing purposes. The second input to the XOR gate 40 is supplied with the output signal of the previous SAR channel $30_{i-1}$. The output of the XOR gate 40 is coupled to a first input of a multiplexer 44 whose second input is supplied with the output of another multiplexer 46 having its first input coupled to a "Write Data" bus 47 on which data is written for entry into the SAR channel $30_i$ to "seed" the SAR with an initial value. The multiplexer 46 is controlled by the control signal B$\phi$ from the BIST controller 32 of FIG. 1. Depending on the state of the control signal B$\phi$, the multiplexer 46 will pass the input signal from a selected one of its two inputs to its output.

The output of the multiplexer 44 is supplied to a flip-flop 48 whose output is fed back to the second input of the multiplexer 46. The flip-flop 48 also feeds one of the inputs of the bypass multiplexer 34. While each bypass multiplexer 34 has been descried with respect to FIG. 2 as directly feeding a separate input of the data path circuitry 12 of FIG. 1, it may be desirable to interpose a flip-flop 50 (shown by dashed lines) between the bypass multiplexer and the data path circuitry to control the timing of the signals supplied thereto. Both the bypass multiplexer 34, as well as the multiplexer 44, are controlled by a control signal B1 generated by the BIST controller 32 of FIG. 2. Depending on the state of the control signal B1, each of the multiplexers 44 and 34 will pass the signal at a selected one of its two inputs to the output thereof.

In additional to feeding both the bypass multiplexer 34 and the multiplexer 46, the flip-flop 48 also supplies its output signal to the first input of a multiplexer 52. The multiplexer 52, referred to as the "read multiplexer", has is second input coupled to one or more registers (not shown) within the data path circuitry 12 and/or the control circuitry 14 which store data for output. The read multiplexer 52 will selectively output either the signal received from the flip-flop 48 or the output signals from the data path circuitry 12 and the control circuitry 14 (both of FIG. 1) in response to a control signal (not shown) received by the multiplexers. In this way, the read multiplexer 52 permits the contents of the flip-flop 48 of the SAR channel $30_i$ to be read.

While the operation of the BIST circuit 22 of FIG. 1 has been briefly described previously, a more complete description will now be provided with respect to FIG. 3. During the normal (non-test) mode of operation of the circuit 10 of FIG. 2, the control signal B1 to each bypass multiplexer 34 of FIG. 3 is of a state such that data on a corresponding data line $16_i$ (see FIG. 3), which is received at a first input of the multiplexer, is passed to the data path circuitry 12 of FIG. 2. Thus, the BIST circuit 22 is effectively bypassed. Although the BIST circuit 22 remains bypassed, the flop-flop 48 within each SAR channel $30_i$ can be written to by entering the appropriate data bit through the multiplexer 46. In this way, the SAR 30 of FIG. 2 can be seeded with an initial test value. Alternatively, during this interval, the flip-flop 48 in each SAR channel $30_i$ can be read via the rad multiplexer 52.

Entry of the "self-test" mode of the circuit 10 of FIG. 1 is commenced by entry of a "BIST-Start" to the BIST controller 32 of FIG. 2 from the control circuitry 14 of FIG. 2. In response, the BIST controller 32 initially generates a control signal B$\phi$ of a state such that the AND gate 36 of FIG. 3 of the blocking circuit channel $28_i$ blocks any data from passing into the corresponding SAR channel $30_i$. By the same token, the B1 signal of the BIST controller 32 of FIG. 2 is now at a level such that each bypass multiplexer 34 passes the output signal from the flip-flop 48 (which has been seeded with an appropriate value) to the data path circuitry 12 of FIG. 2, rather than passing the signal from the corresponding loopback multiplexer 26.

Upon receipt of an initial test signal from the SAR 30, the data path circuitry 12 generates an initial response signal which is fed back to the BIST circuit 22 through the loopback data lines 24. The initial response signal is not immediately received by the SAR 30. Rather, the B$\phi$ control signal is held at the level such that the AND gate 36 within each corresponding blocking circuit channel $28_i$ of FIG. 3 blocks the initial response signal received thereby for a predetermined period of time. The period of delay is made sufficiently long to allow the test signals to initialize the data path circuitry 12 of FIG. 2 and cause the circuitry to return known data to the input to each loopback multiplexer 26. Typically, the length of the delay interval is selected to be at least as long as the delay interval of the longest path in the data path circuitry 12 of FIG. 2.

Only after the predetermined delay interval does the BIST controller 32 of FIG. 2 change the state of the control signal B$\phi$. Once the control signal B$\phi$ changes state then, each blocking circuit channel $28_i$ of FIG. 3 permits the corresponding response signal bit from the data path circuitry 12 of FIG. 2 to enter the SAR channel $30_i$ for compaction with the response signal bit of the preceding SAR channel. Following compaction, the BIST controller 32 of FIG. 2 changes the state of the control signal B1, and, as a consequence, each multiplexer 48 of each SAR channel $30_i$ now outputs a test signal to the data path circuitry 12. In response to each subsequently generated test signal from the SAR 20, the data path circuitry 12 of FIG. 1 will produce another response signal. Each response signal generated subsequent to the initial response signal is supplied directly to the SAR 30 without any blocking.

The following steps: (a) test signal output to the data path circuitry 12, and (b) compaction of response signals from the data path circuitry, are repeated for a predetermined number of clock signals, as produced by a global clock (not shown) on the integrated circuit 10 of FIG. 1. Should the data path circuitry 12 of FIG. 1 contain one or more faults, then the resultant signature (i.e., contents) of the SAR 30 after compaction will deviate from the corresponding signature for a fault-free test sequence. The larger the number of faults, the more quickly the signature stored in the SAR 30 after each compaction will diverge from a fault-free signature. Since each successive test signal applied to the data path circuitry 12 is derived from the response signal produced by the data path circuitry following receipt of the previous test signal, changing the set of test signals initially seeded into the SAR 30 will effect the resultant response signals. This affords the ability to establish one or more seed values which afford the highest fault coverage.

Figure 4:
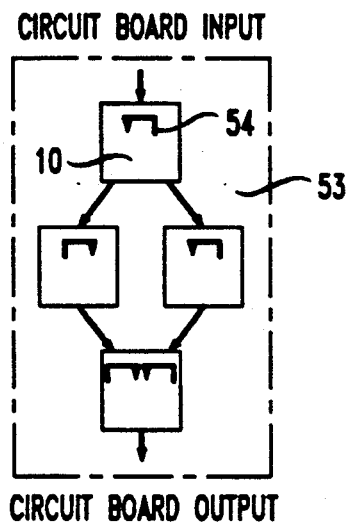
FIG. 4 is block diagram of a plurality of integrated circuits of the type shown in FIG. 1, for the condition where each integrated circuit only tests itself.
Figure 5:
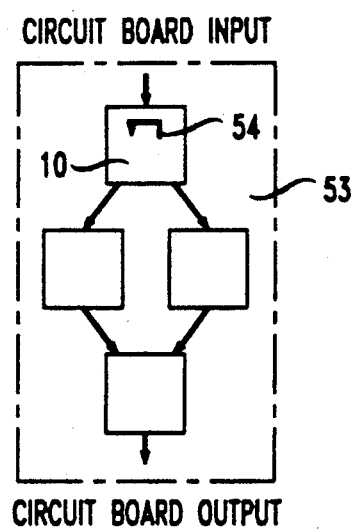
FIG. 5 shows the condition under which a single circuit of FIG. 1 is operated to diagnose each of a plurality other such circuits.

The BIST circuit 22 of FIG. 2 affords the ability of testing at different levels. Referring now to FIG. 4, there is shown a plurality of integrated circuits 10 of FIG. 1 (carried by a circuit board 53, each integrated circuit containing the BIST circuit 22 of FIG. 2). When the BIST circuit 22 of FIG. 2 within each integrated circuit 10 of FIG. 4 has its "loopback" function activated as (as indicated by the loopback symbol 54), so that the output data from each integrated circuit is looped back to its input during testing, then each integrated circuit will test itself separately. Referring to FIG. 5, the entire circuit board 53, including the connections between the integrated circuits 10, can be tested by causing a first integrated circuit 10, which drives (supplies data to) each of the other integrated circuits on the board, to have its loopback function activated, as indicated by the presence of the loopback symbol 54 in that integrated circuit. In this way, a test signal from the driving integrated circuit 10 will propagate through each of the succeeding integrated circuits on the circuit board to the point of a fault.

Figure 6:
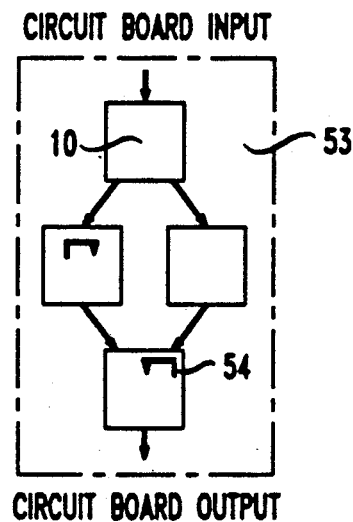
FIG. 6 shows the condition where each of a pair of circuits of FIG. 1 can be operated to test an interconnection between them.

Once a fault has been detected, the fault can be located by choosing successive clusters of two or more integrated circuits 10 and activating the loopback function of each such integrated circuit as shown in FIG. 6. If the fault lies within a connection path between a pair of integrated circuits 10, resolution of this fault can be had by appropriately grouping the data to the loop back multiplexers 26 (see FIGS. 2 and 3) within each integrated circuit to isolate such a fault. This approach to detecting interconnection faults can easily be extended to detect interconnection faults between two circuit boards 52 connected by way of a backplane (not shown).

A distinct advantage of the BIST circuit 22 is that the circuit incurs a much smaller overhead penalty than those of the prior art. Assuming that each of the multiplexers 26, 34, 44, 46 and 52 and the XOR gate 40 of FIG. 3 may be represented equivalently by three individual logic gates (AND, OR, NOR or NAND) (not shown) and that each of the flip-flops 38, 42, 48 and 50 may be presented by the equivalent of five individual logic gates (not shown), the total number of equivalent gates ($G_{dp}$) added per data line $16_i$ is 39. Even when the equivalent number of gates is added to the value $G_{dp}$ to provide for the necessary control, the maximum number of equivalent gates per data path increases only to 51, still a relatively low value.

The foregoing discloses a test circuit 22 for inclusion within an integrated circuit 10 to test at least a portion thereof by generating test signals via a signature analysis register 30 within the test circuit and by compacting response signals at the signature address register generated by the integrated circuit in response to the test signals.

It is to be understood that the above-described embodiments are merely illustrative of the principles of the invention. Various modifications and changes may be made thereto by those skilled in the art which will embody the principles of the invention and fall within the spirit and scope thereof.

What is claimed is:

1. A method for testing an electronic circuit which is normally supplied with input data, comprising the steps of:

(a) multiplexing input data which is normally supplied to an electronic circuit with at least one test signal from a signature analysis register so that during a preselected interval, the test signal is applied to the electronic circuit to cause it to generate a response signal of a known state when the electronic circuit is operating properly, while during intervals other than the preselected interval, the input data is supplied to the electronic circuit;

(b) supplying each response signal, through a delay circuit, to the signature analysis register;

(c) delaying, at the delay circuit, an initial response signal prior to passage to the signature analysis register;

(d) compacting, at the signature analysis register, each successive response signal with the response signals previously applied to the signature analysis register to yield a signature representative of the state of the compacted signals;

(e) repeating the steps of (a), (b) and (d) for a prescribed number of times; and (f) comparing the signature of the compacted response signals to a signature which represent a fault-free condition to detect if any faults are present.

2. The method according to claim 1 further including the step of multiplexing the response signals applied to the signature analysis register with the input data supplied to the electronic circuit.

3. The method according to claim 1 wherein the initial response signal is applied to the signature analysis register only after an interval at least as long as that required for the test signal to propagate through the electronic circuit being tested.

4. The method according to claim 1 further including the step of seeding the signature analysis register with an initial value prior to testing of the electronic circuit.

5. A method for testing a circuit board carrying a plurality of individual electronic circuits connected so that a first one of the circuits drives each of the others, comprising the steps of:

(a) multiplexing input data which is normally supplied to a first electronic circuit on a circuit board, which drives each of a plurality of second electronic circuits on the board, with at least one test signal from a signature analysis register, so that during a preselected interval, the test signal is applied to the first electronic circuit which generates a response signal for propagation through to each of the second electronic circuits driven thereby, while during intervals other than the preselected interval, the input data is supplied to said first electronic circuit;

(b) supplying the response signal from a last one of said second electronic circuits, through a delay circuit, to the signature analysis register;

(c) delaying, at the delay, circuit an initial response signal prior to passage to the signature analysis register;

(d) compacting, at the signature analysis register, each successive response signal with the response signals previously applied to the signature analysis register to yield a signature representative of the state of the compacted signals;

(e) repeating the steps of (a), (b) and (d) for a prescribed number of times; and (f) comparing the signature of the compacted response signals to a signature obtained for a fault-free circuit board to detect if any faults are present.

6. The method according to claim 5 wherein the initial response signal is applied to the signature analysis register for compaction after an interval at least as long as that required for the test signal to propagate through to the last one of the second electronic circuits.

7. The method according to claim 5 further including the step of seeding the signature analysis register with an initial value prior to testing.

8. A built-in self-test circuit for insertion within an electronic device for testing the device, comprising:

a signature analysis register for generating test signals for input to an electronic device to cause the device to generate response signals, and for compacting such response signals to yield a signature indicative of the operation of the device;

bypass multiplexer means coupled between the electronic device and the signature analysis register for multiplexing input data normally supplied to the electronic device with test signals from the signature analysis register, so that during preselected intervals, the test signals from the signature analysis register feed the electronic device, while during intervals other than said preselected intervals, said input data is fed to the electronic device;

loopback multiplexing means for multiplexing the input data normally supplied to the electronic device with response signals produced by the electronic device, so that during selected intervals, the loopback multiplexing means passes the response signals, while during other than said selected intervals, the loopback multiplexing means passes the input data;

blocking means coupled between the loopback multiplexing means and the signature analysis register for delaying transmission of an initial one of the response signals from reaching the signature analysis register for a predetermined interval; and controller means for controlling the signature analysis register, loopback multiplexing means, bypass multiplexing means, and the blocking means.

9. The apparatus according to claim 8 wherein the controller means comprises a counter.

10. The apparatus according to claim 8 wherein the electronic device has n separate data inputs and wherein the signature analysis register comprises n channels, each channel comprised of:

a multiplexer having a first input and a second input;

a flip-flop for producing an output signal in accordance with a signal provided by the multiplexer, the flip-flop output signal supplied to a first input of the multiplexer; and an exclusive OR gate having its output coupled to a second input of the multiplexers, the exclusive OR gate having a first input coupled to a separate one of the n data inputs to the electronic device and a second input coupled to the output of the flip-flop associated with the n−1 channel.

11. The apparatus according to claim 10 wherein the loopback multiplexing means comprises:

n separate multiplexers, each having a first input coupled to a separate one of the n data inputs to the data path circuitry and a second input supplied with an output of the electronic device.

12. The apparatus according to claim 11 wherein the blocking means comprises:

n separate AND gates, each supplied at a first input with the output of a separate one of the n loopback multiplexers and a second input supplied with a control signal from the controller means.

* * * * *